United States Patent
Retzlaff

(10) Patent No.: US 7,652,867 B2
(45) Date of Patent: Jan. 26, 2010

(54) MOBILE, TRANSPORTABLE, ELECTROSTATIC CHUCK FOR WAFERS MADE OF SEMICONDUCTOR MATERIAL

(76) Inventor: Udo Heinz Retzlaff, In der Molzkaute 31, Kreuztal, NRW (DE) 57223

( * ) Notice: Subject to any disclaimer, the term of this patent is extended or adjusted under 35 U.S.C. 154(b) by 436 days.

(21) Appl. No.: 11/651,191

(22) Filed: Jan. 10, 2007

(65) Prior Publication Data

US 2007/0258185 A1  Nov. 8, 2007

(30) Foreign Application Priority Data

May 3, 2006 (DE) .................. 20 2006 007 122 U

(51) Int. Cl.
*H01T 23/00* (2006.01)
*H01L 21/683* (2006.01)
*H05F 3/00* (2006.01)
*F41B 15/04* (2006.01)
*H01G 7/02* (2006.01)

(52) U.S. Cl. ................. 361/234; 361/231; 361/232; 361/233

(58) Field of Classification Search ......... 361/234, 361/231, 232, 233; 310/309
See application file for complete search history.

(56) References Cited

U.S. PATENT DOCUMENTS

| | | | | |
|---|---|---|---|---|
| 4,427,989 A | * | 1/1984 | Anantha et al. | 257/212 |
| 4,551,192 A | * | 11/1985 | Di Milia et al. | 156/345.51 |
| 4,763,179 A | * | 8/1988 | Tsubouchi et al. | 257/301 |
| 5,047,818 A | * | 9/1991 | Tsukamoto | 257/297 |
| 5,151,845 A | | 9/1992 | Watanabe et al. | |
| 5,255,153 A | | 10/1993 | Nozawa et al. | |

(Continued)

FOREIGN PATENT DOCUMENTS

DE  203 11 625  11/2003

(Continued)

OTHER PUBLICATIONS

Watanabe et al., "Relationship between Electrical Resistivity and Electrostatic Force of Alumina Electrostatic Chuck," Jpn. J. Appl. Phys., vol. 32, Part 1, No. 2, Feb. 1993, pp. 864-871. (Spec, p. 2).

(Continued)

*Primary Examiner*—Fritz M. Fleming
*Assistant Examiner*—Lucy Thomas
(74) *Attorney, Agent, or Firm*—Collard & Roe, P.C.

(57) ABSTRACT

A mobile, transportable, unipolar electrostatic chuck for clamping thin wafers is described, which avoids unintentional discharging of the package of Mobile Chuck and wafer during wet processing. Short circuits between the contact holes of the chuck and the clamped wafer can lead to the loss of clamping force. A pn-junction within the semiconductor substrate material electrode of the chuck is disclosed, which is using a diode effect to avoid the loss of charges. Dielectric protection layers of PTFE, $Y_2O_3$ or ferroelectric materials can be used to cover the open contacts of the chuck. This enables the application of Mobile Chucks also for wet etch-, photo- and cleaning processes. Mobile Chucks are made of semiconductor material and semiconductor manufacturing processes are applied. Those Mobile Chucks have nearly identical properties as the clamping substrate itself. This reduces the risk of cross-contamination, particle generation and the risk of mechanical stress due to different coefficients of thermal expansion.

10 Claims, 3 Drawing Sheets

Charging of Mobile Chuck

U.S. PATENT DOCUMENTS

| | | |
|---|---|---|
| 5,909,355 A | 6/1999 | Parkhe |
| 6,174,583 B1 | 1/2001 | Yamada et al. |
| 6,215,641 B1 | 4/2001 | Busse et al. |
| 6,268,994 B1 | 7/2001 | Logan et al. |
| 6,483,690 B1 | 11/2002 | Nakajima et al. |
| 7,027,283 B2 | 4/2006 | Landesberger et al. |
| 7,336,015 B2 | 2/2008 | Arlt et al. |
| 2002/0110449 A1 | 8/2002 | Arlt et al. |

FOREIGN PATENT DOCUMENTS

| | | |
|---|---|---|
| DE | 20 2005 004 589 | 8/2005 |
| DE | 10 2004 041 049 | 1/2006 |
| DE | 10 2004 045 447 | 3/2006 |
| EP | 0 693 771 | 1/1996 |
| EP | 0 768 389 | 4/1997 |
| EP | 0 948 042 | 10/1999 |
| EP | 1 217 655 | 6/2002 |
| FR | 2 774 807 | 8/1999 |
| WO | WO 02/11184 | 2/2002 |

OTHER PUBLICATIONS

Mahmood, Naim, "A New Age of Electrostatic Chucks," Semiconductor Manufacturing, Aug. 2003, pp. 94-106. (Spec, p. 2)

* cited by examiner

Fig. 1: Mobile Chuck with Wafer
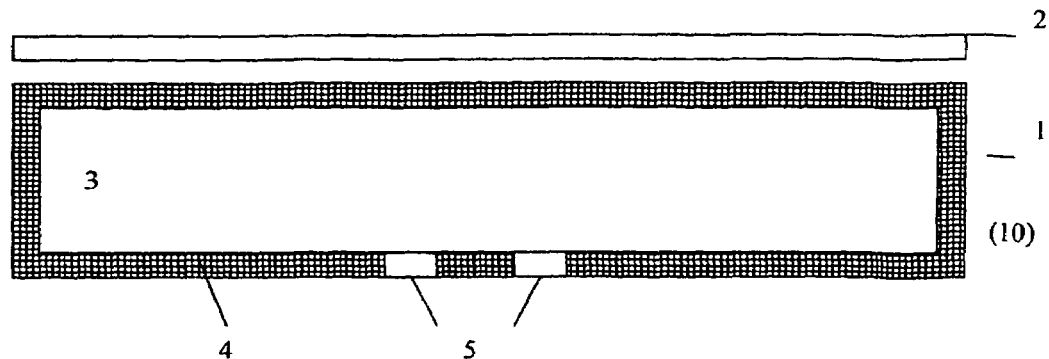
Fig. 2: Charging of Mobile Chuck
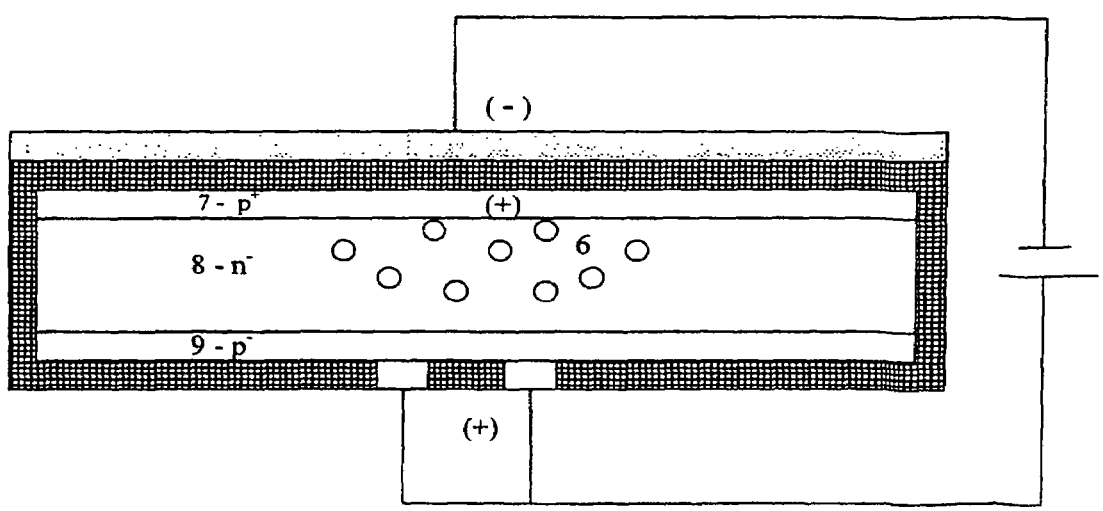
Fig. 3 Unintentional Discharge
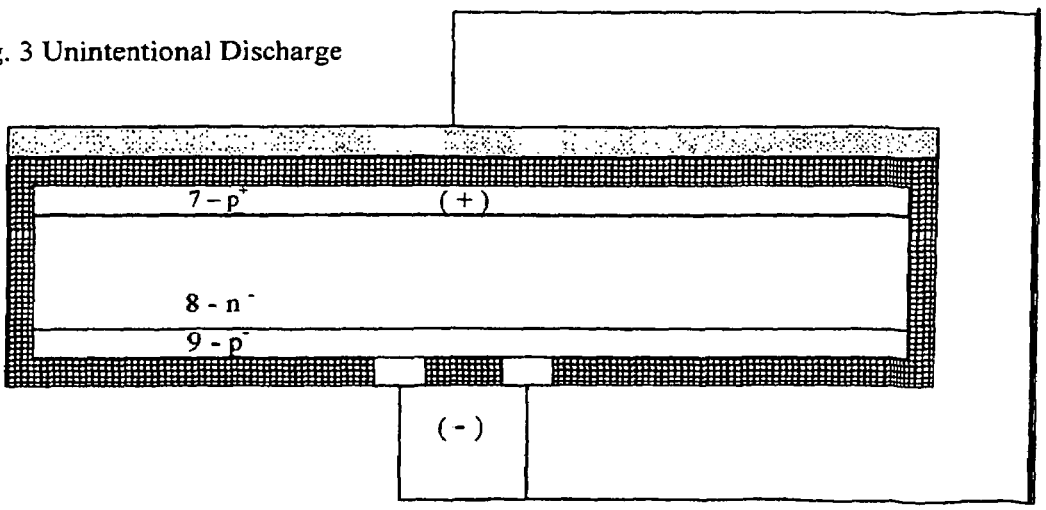

Fig. 4: Switch of Polarity of Mobile Chuck and Wafer
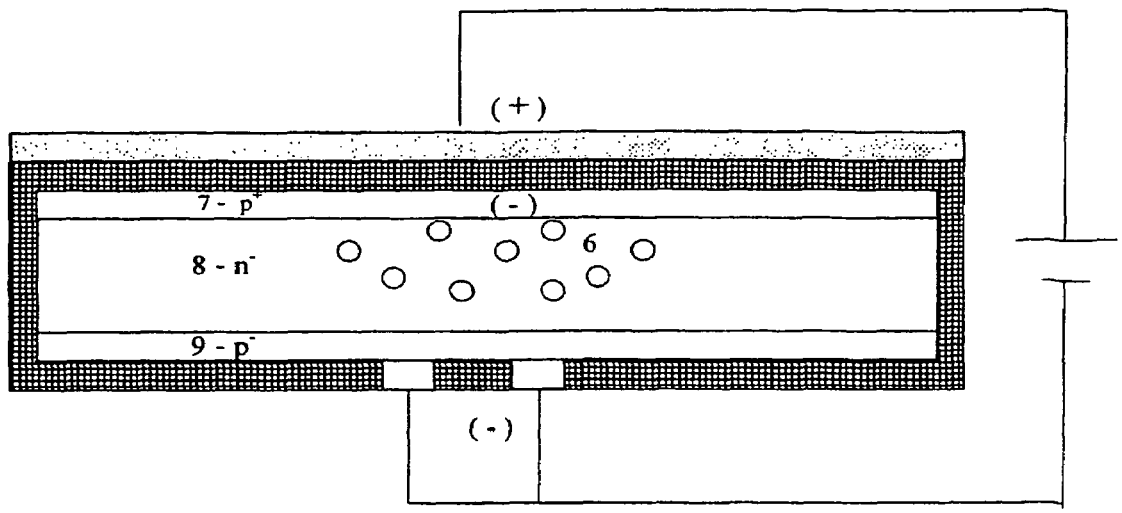
Fig. 5: Discharging of Mobile Chuck and Wafer
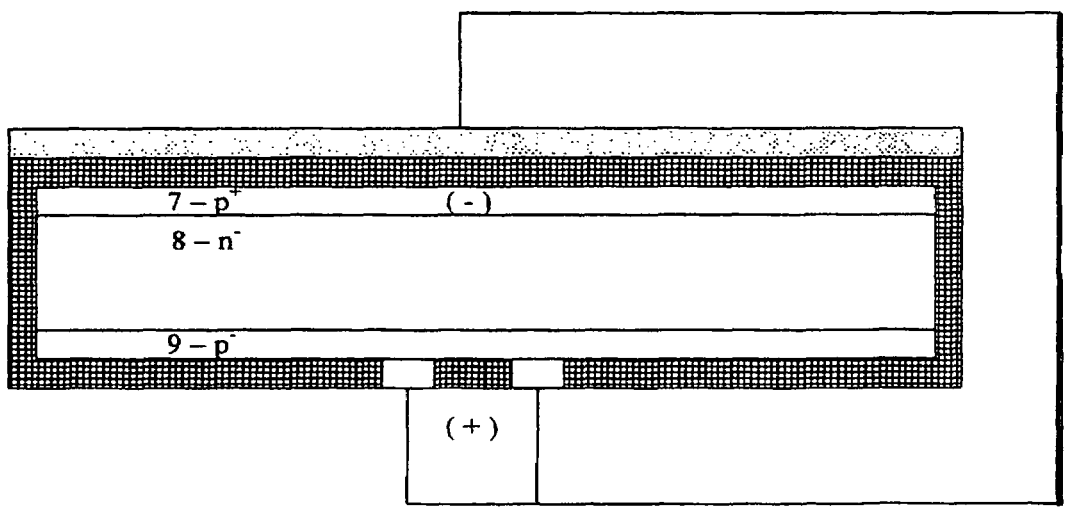

Fig. 6: Mobile Chuck – with local pn-junction
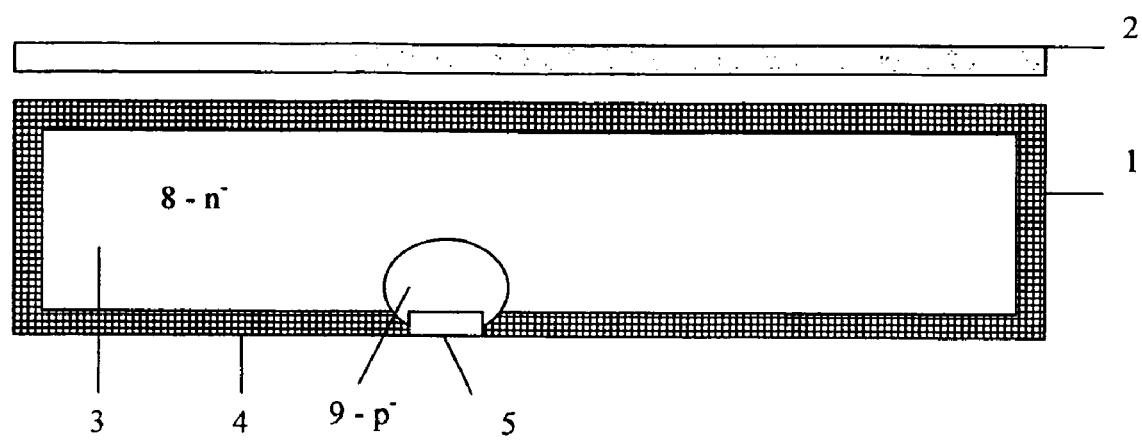

MOBILE, TRANSPORTABLE, ELECTROSTATIC CHUCK FOR WAFERS MADE OF SEMICONDUCTOR MATERIAL

FIELD OF THE INVENTION

The present invention relates to an electrostatic chuck made of semiconductor material for wafer handling and especially to mobile, transportable electrostatic chucks, were the Mobile Chuck keeps clamping a thin wafer after charging (applying a clamping voltage) without permanent connection to an external power supply unit for transportation or other process steps up to several hours. As used herein, a "wafer" encompasses any of the various types of substrates that can be held on a chuck, including semiconductor wafers, solar cells, glass or ceramic plates, or any of various other suitable substrates.

BACKGROUND OF THE INVENTION

Wafers are used in the Semiconductor and Solar industry. Typically they are round or have a stable, rectangular shape. Semiconductor wafers of 4" up to 12" are used with a standard thickness between 500 μm up to 875 μm. But there active elements, e.g. transistors have a pn-junctions depth of only 0, 1 to 5 μm. Thus, most of the material of the pure, often defect free wafers is used as an expensive carrier material to enable a reliable, stable mechanical handling and processing of the wafers within different production environments. Once those wafers become thin (after grinding they are less than 150 μm) they start to bow because of the gravity or other stress generating factors like grinding imperfections, crystal defects, thermal stress etc. For example a stress relieved (100) oriented 8" Silicon wafer of 150 μm thickness, placed in a standard vertical wafer boat, shows a bow of about 2 mm from gravity stress only. Even a different bow behaviour in [110] and [100] directions occurs, because of there mechanical anisotropy of Young's Modulus (E) of about $1.7*E+11$ Pa in [110] and $1.3*E+11$ Pa in [100] directions. This variation can also course saddle like warpage. By the way, (111) wafers do not show this anisotropy in directions perpendicular to [111], the Young's Modulus value in those directions is constant at $1.7*E+11$ Pa. With decreasing wafer thickness, warpage and bow increase significantly and can get unpredictable, so automated wafer handling becomes more and more challenging. Wafers with less than 100 μm even become foil-like with a transition from rigid to flexible, but they are also becoming even more brittle. So there is a need to protect those thin wafers against breakage and, if possible, keep them flat all time. The preferred solution is to clamp those thin wafers permanently on a mobile, electrostatic chuck.

Stationary electrostatic chucks are used to clamp wafers or other disk-shaped conducting or semi-conducting substrates, in particular as holding device in semiconductor processing equipments, for many years. The operating principle is described in detail in publications such as: Watanabe et. al.: Jpn. J. Appl. Phys., Vol. (32), 1993 864-871 and Mahmood Naim: Semi-conductor Manufacturing, August 2003, 94-106. Stationary electrostatic chucks are installed within many process tools and they are permanently connected to a power supply unit. Because those chucks have a fixed place within the tool, they can not be used in a mobile mode. By employing different materials for the dielectric insulation of the chucks, different leakage currents occur.

Chucks, which take advantage of the Johnsen-Rahbeck-effect, use a generated small current flow to increase the clamping force. The needed current is supplied from a permanently connected power unit. Technical solutions are described in U.S. Pat. No. 6,174,583, U.S. Pat. No. 5,151,845, U.S. Pat. No. 5,909,355, U.S. Pat. No. 6,268,994 as well as EP 0768389. Those ceramic chucks, made by thick-layer-technologies, show a high voltage breakdown resistance, are able to withstand high temperatures and have good resistance against different chemical and plasma processes. Chucks, which allow only a very small leakage current based on the material selection, are called Coulomb-Chucks. Those chucks have a typical specific electrical resistance of the dielectric layer of more than 10E15 Ohm*cm. Especially the use of polyimide foils or PTFE can reach this demand, but also chucks made of high resistant $Al_2O_3$-ceramics or silicon carbide are in use (see also U.S. Pat. No. 5,255,153, EP 0 693 771, EP 0 948 042 and U.S. Pat. No. 6,483,690). Those chucks can work in a unipolar mode (mostly in conjunction with a plasma process) as well as in bipolar modes.

The methods for applying these principles to mobile, transportable electrostatic support carriers are described in detail in EP 1217655A1, US 2002/0110449A1, FR 2774807, U.S. Pat. No. 4,551,192 and WO/02 11184 A1, they represent the prior art. Mobile, transportable electrostatic chucks, so-called "Mobile Chucks", are used for mechanical holding of film-like materials. Those support carriers allow a safe manipulating of thin, brittle wafers on existing production equipment and the storage in or between production steps because the size and thickness of the clamped substrate on the mobile, transportable electrostatic chuck is similar of size, thickness and shape as a standard wafer. The practical application of this new manipulation method resulted in the development of first samples of mobile, transportable electrostatic chucks, in particular for the semiconductor industry; compare DE 20311625, DE 102004045447, DE 202005004589 and DE 102004041049. However, the first proposed Mobile Chucks made of ceramic or polyimide materials fulfilled only unsatisfactorily some of the technical and economic requirements as a high particle generation on the surface and a high complexity (cost) during there manufacturing process. All through the risk of breakage of a thin (<150 μm) and ultra thin (<50 μm) substrate is drastically reduced during many manipulation and process steps, there is still a problem with the clamping power in high humidity environments or during wet processes. Typically back side contacts for charging the Mobile Chucks are employed. Those back side contacts can be the root course for an unintentional discharging effect which reduces the clamping force and thus the clamped substrate can get lost. Processes which can be impacted seriously are: grinding, photolithography, wet etch and cleaning.

The most important feature of Mobile Chucks is that they are mobile. That means that they do not need a permanent power supply and for this reason they can be moved or transported inside or outside of process tools without limitations. Mobile Chucks are Coulomb-Chucks. The goal is to eliminate leakage currents or reduce them drastically. This means that the insulation effect of the dielectric layer must be very good in order to achieve a long lasting clamping effect. After charging, the energy is stored in a capacitor structure which is build up between the Mobile Chuck electrode/dielectric layer/wafer (substrate to be clamped). High leakage currents would quickly reduce the stored energy and this would only allow a short clamping time. In addition, a good insulation of the electrodes against humidity is desirable because unintentional discharging of the electrodes can happen due to the open contact area, which is accessible to the outside environment. Thus the risk is high that the clamping force between the thin wafer and the Mobile Chuck is reduced to early. The clamping force of Coulomb Chucks is proportional to the square of the applied clamping voltage (U), the dielectric constant ($\in_r$) of the insulator layer and is indirectly proportional to the square of the thickness of the insulator layer (d). Thus, a strong electrostatic holding force is obtained by having a high clamping voltage (U ~1000 V) with a high dielectric constant of the material ($\in_r$>3.5) and a very small thickness of the insulation layer (d). Obviously, high clamping forces for Mobile Chucks can be achieved using thin film technologies.

The insulation of open contact areas of Mobile Chucks, which is accessible to the outside environment, has been discussed in some patents mentioned above. They propose special insulation layers, which are building up on top of the open contact area in order to insulate the electrode from the surrounding environment, process conditions like humidity or liquids. In particular protection layers from so called ductile insulation materials made of silicone or polyethylene-foils, on top deposited layers of electrically insulating semiconductor materials or mechanical- or electromagnetic switches are proposed to avoid unintentional discharging effects. Protection layers made of silicone or polyethylene-foils are typically 10 µm to 100 µm thick. This is a clear disadvantage because those kinds of layers have strong limitations during the semiconductor IC manufacturing process. Mechanical- or electromagnetic switches can be produced using methods known from micro-system-technology, but there integration as well as the additional deposition of semiconductor layers will generate high manufacturing costs. The use of Schottky diodes on top of the open contact areas are also not sufficient, because there breakdown voltage is relatively low and there leakage current is relatively high in comparison with pn-junction diodes.

SUMMARY OF THE INVENTION

In view of the shortcomings described above, the object of the invention is to create mobile, transportable electrostatic chucks (Mobile Chucks) at a reasonable cost with low leakage currents and high Young's Modulus values, which show a good insulation of the electrodes against unintentional discharging effects due to open contact areas, which are accessible to the outside environment with humidity and liquids and which keep a high, long lasting clamping force and a stable shape under those conditions without being connected with a power supply unit.

According to this invention the solution of a new type of mobile, transportable electrostatic chucks is described in claim 1. The principle of a unipolar electrostatic chuck is applied. The mobile, transportable unipolar electrostatic chuck is made of a semiconductor material (for example a silicon wafer) and is completely covered with a dielectric insulating layer. One or more contact holes through the dielectric layer are opened on the backside for the electrical connection to the semiconductor material. The clamping substrate, most likely a thin processed silicon wafer, can than be hold on the front side of the Mobile Chuck. In order to do this, the clamping substrate is connected to a ground potential and the other electrode is charged with positive or negative potential of 300 V respectively. This results in a long time lasting, sufficient high electrostatic clamping force. No other electrode like a plasma source is needed for clamping, transportation or processing. After charging, there is no need for any permanent connection to an external power supply unit anymore for keeping the clamping force for a long period of time. Moreover, differently charged, doped semiconductor p- and n-type layers inside the substrate material create a diode. The construction and working principle of diodes with a diffusion pn-junction is well known. When a diode is reverse biased a positive voltage is applied to the cathode with respect to the anode, an electric field is formed between the cathode and anode specifically across the depletion region. Diodes which are reverse biased cannot conduct. This prevents unintentional discharging. pn-junctions can reach a breakdown voltage of few hundred volts, which typically requires a depletion region of up to few hundred µm inside the substrate material. Mobile Chucks with pn-junction have only one type of doped layers in direct contact to the environment through the contact holes. The other area of the semiconductor material is completely covered by the dielectric layer. When the wafer to be clamped is charged—for example—negative (−), than the substrate material of the Mobile Chucks has to have a positive (+) potential. Between the wafer (electrode 1) and the substrate material (electrode 2) an insulation layer is build up, which prevents the exchange of charges. The resulting structure creates a capacitor, which is working like a plate-capacitor. The electrostatic field between the electrodes generates the force component which clamps the wafer on the Mobile Chuck. Although, within the substrate material a couple of pn-junctions can be brought in, the whole substrate material is working as one unipolar electrode once fully charged.

The charging of the Mobile Chuck injects charges into the substrate material through the typically used backside contacts. The charges penetrate the depletion region and enrich in proximity to the insulation region, which is close to the attached wafer (electrode 1). This is assisted by the effect of a Metal-Oxide-Semiconductor structure, which is given by the clamped wafer attached on the insulation oxide of the semi conducting material of the Mobile Chuck. The charging voltage is supplied through contact needles on the contact holes. Then the power supply is cut off after charging. The plate-capacitor is now charged (activated) and the wafer is directly clamped on the Mobile Chuck. The circuitry of this structure is now a capacitor linked in series to a diode (pn-junction) and a resistance (contact area). In case of unintentional discharging, may be a short circuit between the backside contacts of the Mobile Chuck and the clamped wafer through some liquid, the plate-capacitor can not be completely discharged because the pn-junction of the diode will be reverse biased and that's why the discharging of the capacitor is stopped. The depletion region of the diode can extend far into the substrate material which enables a high breakdown voltage. The clamping force of the capacitor is still there, may be a little bit reduced, but the wafer clamps on the Mobile Chuck.

Additional conductive areas at the edge (10) and or on the back side of the Mobile Chuck can be produced by means of MOS-effects. For this an external gate voltage can be supplied on the edge of the Mobile Chuck, which than forms a charged channel below the insulation oxide. This gate voltage can be provided exemplarily by a surrounding, close attaching metal ring which is charged with direct or even with alternating current. When a voltage is applied between the gate and source terminals, the electric field generated penetrates through the oxide and creates a so-called "inversion channel" in the channel underneath (enhancement or depletion type) within the substrate material of the Mobile Chuck. This effect is known from MIS-Field-Effect-Transistors. This inversion channel can than be used to fast charging or discharging of the Mobile Chuck, where the first blocking pn-junction is passed by.

Also according to the invention an additional dielectric layer can be build up on to of the open contact area. This additional dielectric layer has typically a high $\in_r$-value, for example made of lead-barium-strontium-titanate or yttrium oxide. There break-down voltage is designed in a way that the electric breakdown occurs below the charging voltage, what enables the charging. This means that the breakdown voltage of the additional dielectric layer is less than the breakdown voltage of the dielectric layer of the Mobile Chuck itself. After the first charging process a microscopic small breakdown channel of a few micrometer or manometers is created. This breakdown channel is much smaller than the about one millimeter diameter contact holes. During the following charging processes this existing microscopic breakdown channel is used again. Even small deviations of the contact needles can be compensated, because surface current effects will guide the current flow again to the week insulation point. Thus only a microscopic small contact point is created. This microscopic small contact point is hardly to be wetted. This is of advantage for the insulation of the contact area against liquids. It is known that different cleaning procedures are available in the semiconductor technology which can build up hydrophobic surfaces on a dielectric layer. This reduces the likeliness of wetting the channels and thus avoids there conductivity. Microscopic small channels also can be produced with alternative procedures like laser drilling. Also a damp-proofing membrane made of PTFE (Poly-Tetra-Fluoro-Ethylene) can be added to avoid the penetration of liquids. Procedures to manufacture those layers are known from the textile industry. Those membranes are big enough to enable damp to pass through but no liquids. During the unintentional discharging those above described extra layers reduce or even eliminate together or instead of the introduced pn-junction the early, complete discharging of Mobile Chucks.

Dielectric layers made of barium-titanate or lead-barium-strontium-titanate show ferroelectric effects. This means that they can have very high $\in_r$-values (up to 1000) below the Curie-temperature. Above the Curie-temperature the uniform alignment of the dipoles inside the layer will be destroyed by thermal oscillation and the $\in_r$-values drop down (typically <10). This results in a much higher electrical conductivity of the layer. The Curie-temperature of barium-titanate is about 120 C. According to the invention this effect is used by charging and discharging the Mobile Chucks above the Curie-temperature at low $\in_r$-values. Because above the Curie-temperature there are high leakage currents the ferroelectric layer can be seen as an electrical resistor, which enables the charging and discharging without destroying the layer. The heating of the dielectric layer can be made locally limited at the contact points. Contact needles which can be heated and create a local temperature above the Curie-temperature can be employed. Wet etch and cleaning processes as well as grinding and photolithographic processes which are applied during the manufacturing processes of micro-electronic devices are normally below 120 C. At normal process temperatures, e.g. below the Curie-temperature, the ferroelectric effect is working which results in high dielectric insulation of the layer. The discharging of the Mobile Chuck will be carried out at temperatures above the Curie-temperature. All those described protection procedures prevent the unintentional discharging of Mobile Chucks and thus the object of the invention is fulfilled.

BRIEF DESCRIPTION OF THE DRAWINGS

The description of the drawings below includes a recitation of preferred and exemplary features. It is to be understood that each of the features can be used in the invention in general, not merely in the context of the particular drawings, and the invention includes any combination or two or more of these features. A representative embodiment of the invention is explained referring to the attached drawings.

FIG. 1 shows a Mobile Chuck with a wafer to be clamped on.

FIG. 2 shows a Mobile Chuck with a clamped wafer during charging.

FIG. 3 shows an unintentional discharging (short circuit) of the package of Mobile Chuck and clamped wafer.

FIG. 4 shows the change of polarity between Mobile Chuck and clamped wafer.

FIG. 5 shows the discharging by a short circuit of the Mobile Chuck and clamped wafer after change of polarity.

FIG. 6 shows a Mobile Chuck with a local pn-junction.

The given embodiments of the different doped regions of the substrate material are selected for a positive charging current connected to the substrate material. In case of a negative charging current it has to be considered that p-layers are changed to n-layers respectively, which is not shown here. FIG. 1 shows a cross section view of a unipolar Mobile Chuck (1), which is made of semiconductor material (3) and the dielectric insulating layer (4); above the wafer (2) to be clamped. FIG. 2 shows according to the invention a cross section view of a unipolar Mobile Chuck (1) with a clamped wafer (2) and differently doped (p- and n-type) semiconductor layers (7,8,9) within the substrate material (3) during the charging procedure. The first pn-junction is in conductive mode (forward biased) and charges (6) are injected through the depletion zone. FIG. 3 shows a cross section view of a unipolar Mobile Chuck (1) with the clamped wafer (2) and with differently doped (p- and n-type) semiconductor layers (7,8,9) of the substrate material (3) during unintentional discharging (short circuit). Now the first pn-junction is reverse biased and cannot conduct, thus the unintentional discharging of the Mobile Chuck (1) is stopped. The clamping voltage drops down a little bit, but the remaining voltage is sufficient to clamp the wafer (2) until the running process is completed. FIG. 4 shows a cross section view of a unipolar Mobile Chuck (1) with the clamped wafer (2) during the change of polarity. FIG. 5 shows a cross section view of a unipolar Mobile Chuck (1) with the clamped wafer (2) during discharging. Now the first pn-junction is in conductive mode. FIG. 6 shows a cross section with differently doped (p- and n-type) semiconductor layers (8,9), where the area (9) is only locally brought in into the substrate material (3).

DESCRIPTION OF THE PREFERRED EMBODIMENTS

The first embodiment describes a capacitor structure of a unipolar Mobile Chuck (1) with clamped wafer (2), as shown in FIG. 1. The Mobile Chuck (1) is build up from a double side polished silicon wafer as semiconductor material (3), a 3.5 μm thick dielectric layer (4) from silicon dioxide and 100 nm silicon nitride with the opened contact holes (5) on the backside. The contact holes (5) are reaching through to the semiconductor material (3) and are used to contact the Mobile Chuck (1) during charging and discharging. The wafer (2) to be clamped, works as the first electrode and the semiconductor—material (3) acts as the second electrode of the capacitor structure. Both electrodes are separated electrically with the dielectric insulating layer (4).

The application of a clamping voltage of 300 V, as described in FIG. 2, generates an electric field between the negative charged—or grounded—wafer (2) and the positive charged semiconductor material (3). The wafer (2) attracts the Mobile Chuck (1) and is now electro-statically clamped (activated). In accordance with the invention, within the substrate material (3) there are differently doped (p- and n-type) semiconductor layers (7,8,9) arranged. The substrate material (3) is a silicon wafer itself, phosphorus doped, n-type with a specific resistance of 10-20 Ohm*cm. This n⁻-type bulk region (8) has the lowest doping level. That's why the depletion region is extending deep into the low doped bulk region. The break trough voltage of the pn-junction is designed to avoid Punch-Through-effects, avalanche breakdown and to reach low leakage currents, herby the breakdown voltage of the diode should be about double than the charging voltage. The thickness of the bulk region (8) is in the embodiment 350 μm. In order to improve the accumulation of charges in the active clamping side of the Mobile Chuck (1), a p-type layer (7) of about 1 μm thickness is build up in close proximity to the thin wafer (2). Once the Mobile Chuck (1) is activated, positive charges will accumulate in this area. Dipoles are created within the dielectric layer (4) below the negative charged wafer (2) and positive charges are generated in this layer (7). A p⁻-type layer (9) is produced on the back side of the substrate material (3) which is about 5 μm deep. This layer (9) is only slightly higher doped than the n-type bulk region (8). This enables a first pn-junction between the layers (8) and (9). Because of a reasonable low doping of the first pn-junction layers the reversed biased breakdown voltage is up to a few hundred volts high. The layer (9) is used to contact the Mobile Chuck (1). For a better contact of the p⁻-type layer (9) a not shown extra p⁺-type layer can be added. During the charging of the Mobile Chuck (1), positive charges (6) are injected from layer (9) through the bulk region (8) into layer (7), as described in FIG. 2. The diode is given by the layer (8) and (9) and works in conductive mode. The package of Mobile Chuck (1) and clamped wafer (2) is now activated and can be moved without any further connection to any power supply unit up to several hours.

In case of an unintentional discharging because of short-circuit during handling or processing of the package, the layer (7) is positive charged (+) and a negative potential (−) is then on the contact area (5), as shown in FIG. 3. Now the first pn-junction, of the diode build by layer (9) and (8) is reverse biased. For the diode to switch off, the charge carriers must either recombine (minority carriers) or be removed, the latter mechanism appearing as a small reverse current (reverse recovery) flowing in the diode as it turns off. This results in a small drop of the clamping voltage because a certain amount of charges is lost, but a significant voltage is still captured in the Mobile Chuck (1) and the unintentional discharging is stopped. The wafer (2) keeps clamping and can further process. In order to take the wafer (2) off from the Mobile Chuck (1), the remaining charges (potentials) must be equalized. This requires that the first pn-junction has to work in a conductive mode. FIG. 4 explains the change of polarity of the wafers (2) and the Mobile Chuck (1). After the change of polarity a short-circuit can be done between the wafer (2) and the Mobile Chuck (1) which discharges the capacitor structure, as shown in FIG. 5. Now the first pn-junction works in conductive mode. Now the thin wafer (2) can be taken off from the Chuck (1).

The second embodiment describes a Mobile Chuck (1) according to FIG. 6 with differently doped (p- and n-type) semiconductor layers (8,9), where the area (9) is only locally brought in into the substrate material (3). The p⁻-type doped area (9) shows only a local limited extension into the n⁻-type bulk region (8). The advantage is that the pn-junction has only a relatively small geometrical extension. This smaller size results in a smaller capacity of the depletion region and thus reduces the switching time of the diode (pn-junction of region 8 and 9) as well as the reverse current. The dielectric layer (4) has a thickness of about 2 μm, which enables the doping of the area (9) after the contact holes (5) are open. Implantation of e.g. Boron through the open contact holes (5) directly into the bulk material and followed by a drive in diffusion creates a locally limited p⁻-type doped area (9). The 2 μm thick dielectric layer (4) is used as implantation mask for the area (9) and thus works as a self positioning mask in relation to the opened contact holes (5).

The deposition of thin layers of PTFE (Teflon) or other suitable materials, which cover local wise or completely the dielectric layer (4), improve the etch resistance of Mobile Chucks (1). This improves the lifetime and also the beak down voltage of Mobile Chucks (1) in etching and cleaning processes. The mechanical protection against scratches and particle generation is an additional positive effect of PTFE layers, which improves the lifetime too. PTFE is able to withstand temperatures of up to 260 C. and has a low surface tension. This is beneficial for the creation of hydrophobic surfaces and thus the attachment of small particles will be suppressed. Alternatively additional layers of yttrium dioxide —$Y_2O_3$— can be used to increase the dielectric layer (4) efficiency as well as there etch resistance. Yttrium dioxide has only a small etch rate during plasma etching with $CF_4/O_2$-plasma which enables a better stability and thus a longer lifetime of the dielectric insulation layer (4).

This invention enables a simple and cost efficient production of mobile, transportable electrostatic chucks by employing processes and materials known from the production of Integrated Circuits which avoids a complete, unintentional discharging of Mobile Chucks and there clamped wafer. An essential advantage is that advanced thin film technologies can be used which are available in state of the art semiconductor production facilities where thin, nearly defect free layers can be generated on silicon wafers and thus Mobile Chucks with high clamping forces and long clamping time are produced. Mobile Chucks are mostly used in clean rooms. The manufacturing of chucks under clean room conditions reduces the size and amount of particles. A high amount of particles can also reduce the clamping forces of electrostatic chucks and thus a tight control of particles is important. The older type of Mobile Chucks made of a ceramic multilayer technology need up to 10 different layers to integrate the stacked capacitors and generates also a lot of particles on the surface. So the use of silicon as the substrate material for the Mobile Chucks, as described, has a clear advantage. The implementation of pn-junctions—diode effects—inside the electrode of the substrate material, the generation of microscopic small contacts, the use of PTFE, yttrium oxide or the application of ferroelectric layers during charging and discharging create protection mechanisms to avoid unintentional discharging of Mobile Chucks due to open contact areas, which are accessible to the outside environment with humidity and liquids and which keep a high, long lasting clamping force under those conditions without being connected with a power supply unit. Those Mobile Chucks have nearly identical properties as the clamping substrate itself, in case of the embodiments, a silicon wafer. This reduces the risk of cross-contamination and the risk of mechanical stress due to different coefficients of thermal expansion drastically as well as it has the same Young's Modulus (E) as a process wafer.

The invention claimed is:

1. Mobile, transportable electrostatic chuck comprising a semiconductor substrate material (3), clamping a thin process-wafer (2) thereon by applying a clamping voltage, without permanent connection to an external power supply unit for transportation or other process steps, where the size and thickness of the clamped wafer and the Mobile Chuck is similar of size, thickness and shape as a standard wafer, comprising:

a semiconductor substrate material (3) used as unipolar electrode;

said semiconductor substrate material (3) comprising a pn-junction made of doped semiconductor n- and p-type layers (8,9) inside the said substrate material (3) creating a diode;

said diode is reverse biased during unintentional discharging by a short circuit between the clamped wafer (2) and the contact holes (5) of the Mobile Chuck (1).

2. The Mobile Chuck as set forth in claim 1, wherein said contact holes (5) are covered with an additional dielectric layer which has microscopic small channels and wherein a hydrophobic surface is build up on the said contact holes (5) which reduces the penetration of humidity and liquids into said small microscopic channels using a combination of the said dielectric layer and the appropriate cleaning procedure.

3. The Mobile Chuck as set forth in claim 1, wherein a porous layer of PTFE covers the said contact holes (5) and is acting as a membrane which avoids the penetration of liquids.

4. Mobile, transportable electrostatic chuck comprising a semiconductor substrate material (3), clamping a thin process-wafer (2) thereon by applying a clamping voltage, without permanent connection to an external power supply unit for transportation or other process steps, where the size and thickness of the clamped wafer and the Mobile Chuck is similar of size, thickness and shape as a standard wafer, comprising said semiconductor substrate material (3) used as unipolar electrode with differently high doped regions of donors n,n+ or acceptors p,p+ build in, which reduces the contact resistance of the contact holes (5) during charging and discharging.

5. The Mobile Chuck as set forth in claim 1 or 4, wherein the said additional dielectric layer covering the said contact holes (5) is made of ferroelectric material.

6. The Mobile Chuck as set forth in claim 1 or 4, wherein a layer of PTFE material is build up partly or completely on the said dielectric layer (4).

7. The Mobile Chuck as set forth in claim 1 or 4, wherein a layer of yttrium dioxide or hafnium dioxide is build up on the said dielectric layer (4).

8. A Method of charging and discharging a Mobile unipolar Chuck made of semiconductor substrate material (3) with a pn-junction of doped semiconductor n- and p-type layers (8,9) inside the said substrate material (3) which creates an internal diode, comprising:

a) that the polarity of the wafer (2) to be clamped and the polarity of the contact hole (5) are applied in a way that the pn-junction of the said internal diode is working in a conductive mode during the charging of the package of Mobile Chuck (1) and wafer (2);

b) that after charging the said unipolar electrode is clamping the wafer to be hold (2) without any connection of the wafer to be hold (2) or the Mobile Chuck to ground or any other potential;

c) that for discharging the polarity of the wafer (2), which clamps on the Mobile Chuck (1), and the polarity of the Mobile Chuck (1) are switched during a first change of polarity step and in a second step a short-circuit between the wafer (2) and the Mobile Chuck (1) is done for the exchange of charges.

9. A Method of charging and discharging of Mobile unipolar Chucks as set forth in claim 8, comprising a gate voltage applied on the edge of the semiconductor material (3) which creates an inversion channel within the Mobile Chuck (1) and short-circuits the depletion region (8).

10. A Method of charging and discharging of Mobile Chucks as set forth in claim 8 or 9, comprising an additional dielectric layer of ferroelectric material covering the contact holes (5), comprising the charging and discharging at a temperature above of the Curie-temperature of the ferroelectric layer.

* * * * *